United States Patent
Morén (10) Patent No.: US 7,480,979 B2
(45) Date of Patent: Jan. 27, 2009

(54) PRODUCTION OF ANTENNA DEVICES

(75) Inventor: Stefan Morén, Kista (SE)

(73) Assignee: AMC Centurion AB, Akersberga (SE)

( * ) Notice: Subject to any disclaimer, the term of this patent is extended or adjusted under 35 U.S.C. 154(b) by 811 days.

(21) Appl. No.: 10/451,437

(22) PCT Filed: Dec. 21, 2001

(86) PCT No.: PCT/SE01/02885

§ 371 (c)(1),
(2), (4) Date: Oct. 17, 2003

(87) PCT Pub. No.: WO02/054841

PCT Pub. Date: Jul. 11, 2002

(65) Prior Publication Data

US 2004/0060162 A1 Apr. 1, 2004

(30) Foreign Application Priority Data

Dec. 29, 2000 (SE) .................................. 0004909

(51) Int. Cl.
*H01Q 1/24* (2006.01)
*H01P 11/00* (2006.01)

(52) U.S. Cl. .................... 29/600; 29/601; 343/702; 343/873

(58) Field of Classification Search .............. 29/600, 29/602.1, 830–834, 825, 829; 343/702, 872–873; 347/7, 19; 340/572.1; 174/250, 261
See application file for complete search history.

(56) References Cited

U.S. PATENT DOCUMENTS

| | | | |
|---|---|---|---|
| 5,558,504 A | 9/1996 | Stridsberg | |
| 5,768,217 A * | 6/1998 | Sonoda et al. | 368/10 |
| 6,120,588 A | 9/2000 | Jacobson | |
| 6,175,752 B1 | 1/2001 | Say et al. | |
| 6,396,444 B1 * | 5/2002 | Goward et al. | 343/702 |
| 6,697,694 B2 * | 2/2004 | Mogensen | 700/119 |
| 6,973,709 B2 * | 12/2005 | Huang | 29/600 |
| 7,102,522 B2 * | 9/2006 | Kuhns | 340/572.7 |
| 7,192,107 B2 * | 3/2007 | Fukano et al. | 347/7 |
| 7,199,033 B2 * | 4/2007 | Hirai et al. | 438/584 |

FOREIGN PATENT DOCUMENTS

| | | |
|---|---|---|
| EP | 0 954 049 A2 | 11/1999 |
| EP | 0 991 014 A2 | 4/2000 |
| WO | WO 99/43037 | 8/1999 |
| WO | WO 00/77854 A | 12/2000 |

* cited by examiner

*Primary Examiner*—Minh Trinh
(74) *Attorney, Agent, or Firm*—Holland & Hart LLP (57) ABSTRACT

A method of producing an antenna device for use with a portable radio communication apparatus includes the steps of (i) providing a dielectric substrate, having first and second opposing surfaces; and an ejection apparatus, having a container filled with a liquid conductive substance, an ejection opening in liquid communication with the container, and an implement for ejecting a liquid conductive substance from the opening in the container; (ii) ejecting the liquid electrically conductive substance from the ejecting apparatus, onto the first surface of the dielectric substrate; and (iii) moving the dielectric substrate and the ejection opening relative to each other while ejecting the liquid conductive substance to form, upon being solidified, a conductive antenna pattern on the first surface of the dielectric substrate.

24 Claims, 5 Drawing Sheets

PRODUCTION OF ANTENNA DEVICES

FIELD OF INVENTION

The present invention relates generally to the field of radio communications and particularly to methods of producing an antenna device for use in a portable radio communication apparatus, to antenna devices produced according to the respective methods, and to portable radio communication apparatus comprising the respective antenna devices.

BACKGROUND OF THE INVENTION AND RELATED ART

As communication devices such as portable radios, cellular telephones, and other personal communication systems become smaller, the electronic components contained within the devices, such as internally mounted antennas, will tend to be smaller also. Such internally mounted antennas have good radiation characteristics, desirable drive point impedance, and simple construction. Further, they are reluctant to damage and they can increase the aesthetic appeal of the devices into which they are mounted compared to devices having externally mounted antennas. However, such internally mounted antennas tend to be bulky and require often additional steps in the assembly process. Mobile communication devices are also subject to cost reduction demands as well as increasing adaptation for large-scale manufacturing. For that reason parts included in a mobile phone are preferably designed to ensure low production and assembling costs.

In order to minimize size requirements and permit low cost production the internally mounted antennas may typically be provided as printed circuit antennas. Two techniques frequently employed in this respect are screen-printing and tampon printing. While such techniques are simple and cost effective they are not very flexible since the antenna patterns to be produced have to be determined at an early stage in the production process. Further, they are difficult to use for the production of antenna patterns onto curved surfaces, particularly concave surfaces, if at all possible.

Still further, it is highly desirable that such printed circuit antennas be mass produced or produced in such a way that costs are reduced and efficiency is increased. It is also desirable that the method of mass producing the printed circuit antennas maintain a high level of flexibility, uniformity and quality.

SUMMARY OF THE INVENTION

In light of the foregoing, a primary object of the present invention is to provide a method of producing an antenna device for use in a portable radio communication device, which method is flexible and provides for redesign, reconstruction and modification to be made of the antenna patterns in the production line.

A further object of the present invention is to provide such method, which allows for mass producing antenna devices.

Another object of the present invention is to provide a process for mass producing printed circuit antennas, which minimizes the time required to produce such printed circuit antennas.

Still another object of the present invention is to provide a process for mass producing printed circuit antennas, which are able to operate within more than one frequency bandwidth.

These objects, among others, are according to a first aspect of the present invention attained by methods as defined in the appended patent claims.

A further object of the present invention is to provide an antenna device for use in a portable radio communication apparatus, which is produced by means of any of the methods according to the first aspect of the invention.

Still a further object of the invention is to provide a portable radio communication apparatus comprising such an antenna device.

Thus, according to a second and a third aspect of the present invention there are provided an antenna device and a portable radio communication apparatus, respectively, as defined in the appended claims.

Advantages of the present invention include, inter alia, manufacture and assembly of antenna devices to a lower cost; use of less components in each of the devices; and a high level of flexibility as it brings design and production of antenna devices together and allows for adjustments, readjustments and modifications of the antenna patterns to be made in the production line without causing any longer delays.

BRIEF DESCRIPTION OF DRAWINGS

The present invention will become better understood from the detailed description of embodiments of the present invention given hereinbelow and the accompanying FIGS. 1-4, which are given by way of illustration only, and thus are not limitative of the present invention.

DETAILED DESCRIPTION OF PREFERRED EMBODIMENTS

Figure 1:
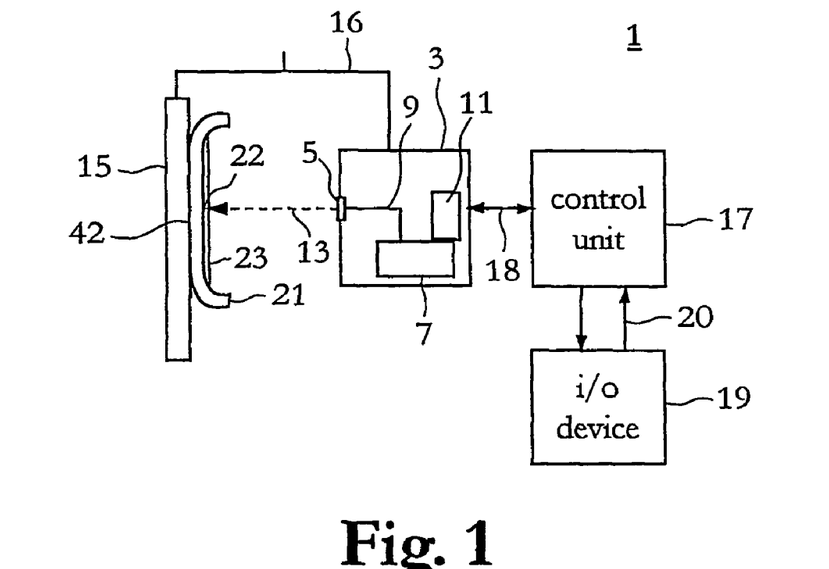
FIG. 1 illustrates, in a schematic view, a system for producing an antenna device according to the present invention.

Referring now to the drawings in detail, wherein identical numerals indicate the same or similar elements throughout the figures, FIG. 1 is a schematic view of a general system 1 for producing an antenna device for use in a portable radio communication device according to the present invention.

System 1 comprises an ejecting apparatus 3 having an ejection opening 5 and typically including a container 7 filled with a liquid conductive substance; a liquid communication path 9 interconnecting container 7 and opening 5; and an implement 11 for forcing liquid conductive substance from container 7 through the communication path and out through opening 5 preferably as a narrowly focused liquid jet 13 or as a close succession of droplets.

The system 1 further comprises a carrier 15 in the form of a bench, worktable, or similar, and a means 16, such as for example a frame or support, for interconnecting ejecting apparatus 3 and carrier 15 in accurately and precisely controlled fashion and for moving the carrier 15 and ejection opening 5 of ejecting apparatus 3 relative each other in a plane substantially perpendicular to the direction of the jet 13 ejected from opening 5.

Further, system 1 includes a control unit 17 connected to ejecting apparatus 3 and to support 16 by means of a two-way communication line 18; and an input/output (i/o) device 19 connected to control unit 17 by means of a further two-way communication line 20. Control unit 17, which typically a microcomputer or similar loaded with suitable software, controls the ejection of liquid conductive substance from opening 5 and the relative movement between carrier 15 and opening 5. By means of input/output device 19, which typically takes the form of a display unit and a keypad or similar, a human operator may control, change, modify, adjust, and supervise the operation of control unit 17.

In operation of system 1 for producing an antenna device a suitable dielectric substrate to carry an antenna pattern is provided. In one version the dielectric is a portion of molded plastic 21 having a first 22 and a second 42 surface opposite to each other, wherein the antenna pattern is to be formed on the first surface thereof and wherein the second surface thereof will constitute the outer casing of the portable radio communication device in which it is to be mounted. However, there are no limitations in this respect and the dielectric substrate may be virtually any kind of dielectric material provided for this purpose only or provided generally for other purposes. Examples of the latter details are SIM-cards, printed circuit boards (PCB's), displays, keypads, batteries, and battery packs.

The dielectric substrate 21 is firmly attached to carrier 15 with its second surface facing the carrier and its first surface facing ejecting apparatus 3.

Then, carrier 15 and ejection opening 5 of ejecting apparatus are moved relative each other while ejecting liquid conductive substance onto the first surface 22 of dielectric substrate 21 to thereby form, upon being solidified, the conductive antenna pattern, which in FIG. 1 is denoted by 23.

By such provisions mass fabrication of antenna devices to a low cost is enabled. Further, very simple antenna devices can be fabricated by the use of few components in each of the devices. As the antenna pattern written onto the dielectric is controlled by means of the control unit and the operator the pattern may easily be changed, adjusted and modified without the fabrication of a new physical original, template, form or similar, as is being needed by using several other printing techniques such as e.g. screen and tampon printing techniques.

The solidification of the antenna pattern may be speeded up by means of heating the liquid conductive substance ejected onto the dielectric substrate; or by means of blowing a gas, particularly dry air, over the dielectric substrate and the liquid conductive substance ejected thereon.

Further, it is possible to use the inventive production method to also form an antenna pattern on the second side 42 of dielectric 21. Such dual antenna pattern may be produced to enhance the RF performance of the antenna device, to allow for multiband operation and/or to form electrical circuits, e.g., matching circuits including capacitors, directly on the dielectric substrate 21.

Thus, the antenna device is released from the carrier 15, turned upside down, and remounted on the carrier 15, whereafter liquid conductive substance is ejected from the ejecting apparatus 3 onto the second surface 42 of dielectric substrate 21 while moving said dielectric substrate and the ejection opening of said ejecting apparatus relative each other. Upon solidification, a second conductive antenna pattern is formed on the second surface of the dielectric substrate (not illustrated).

The liquid conductive substance can be any suitable conducting fluid such as conductive paint, conductive resin, or conductive adhesive and the ejecting apparatus 3 can be any apparatus suitable for the purpose, such as e.g. any of a drops gun, an atomizer, a blow-by gun, and a paint spray gun.

In a preferred version of the invention, however, the liquid conductive substance is conductive ink and the ejecting apparatus is an ink jet printer.

In the following two embodiments of an ink jet printing device suitable to be used in the production process of the present invention is described.

Figure 2A:
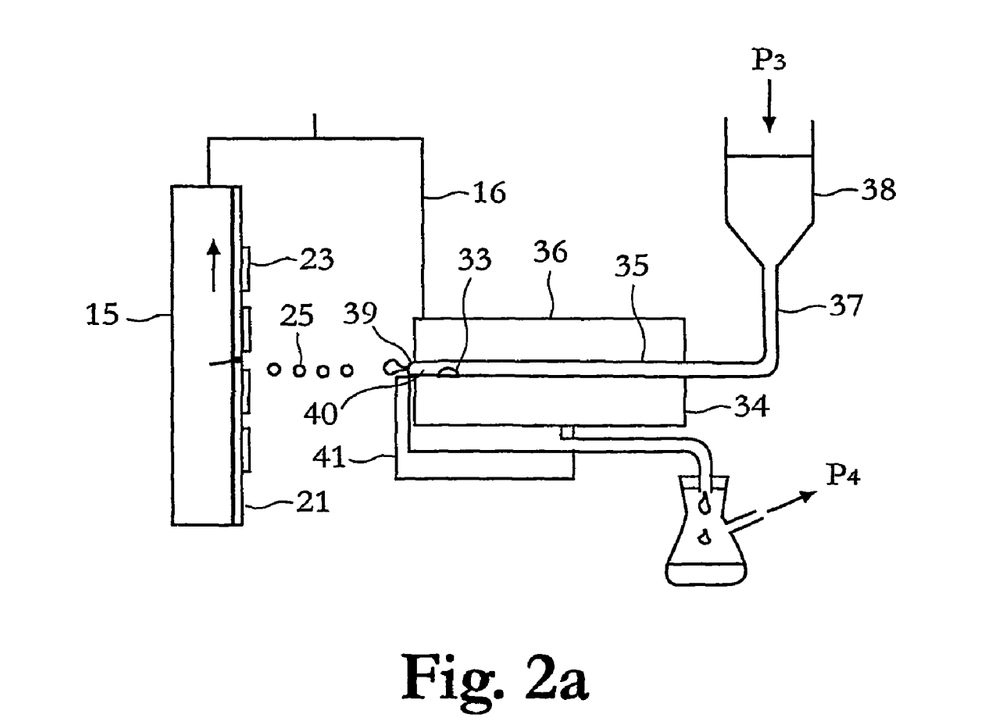
FIGS. 2*a-b* illustrate, in a schematic and in a perspective view, respectively, a first particular embodiment of a device for ejecting a liquid conductive substance as being comprised in an exemplary one of the system for producing an antenna device as illustrated in FIG. 1.
Figure 2B:
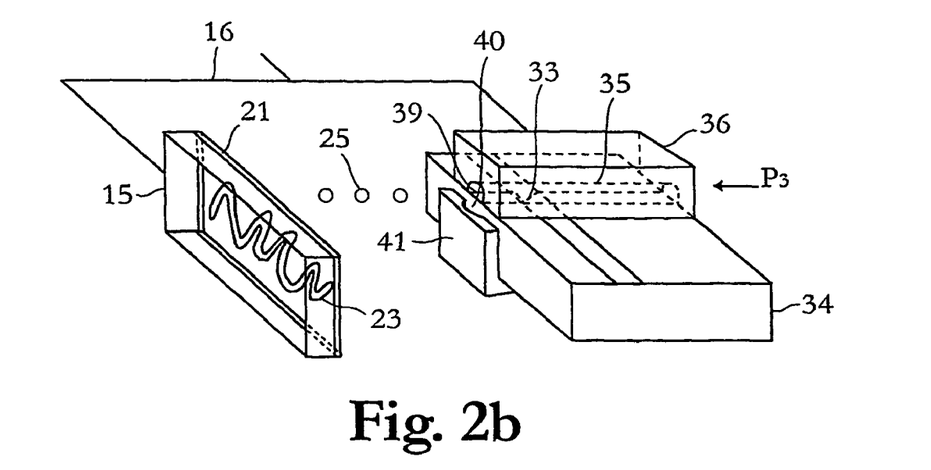

Reference is first made to FIGS. 2a and b, showing the basic structure of an ink jet printing device for safe, rapid and reliable ejection of droplets of a conductive ink, wherein droplet formation is achieved by means of thermal energy. Ink is supplied from an ink supply tank 38 maintained under a predetermined elevated pressure P3 to a printing channel 35 via a conduit 37. As an alternative to a pressurized ink tank, the printing channel 35 can be a capillary channel similarly ensuring reliable ink feed from a tank towards a printing opening 39. The printing channel 35 is formed by means of a base plate 34 and a cover plate 36 provided with an appropriate groove.

The ink jet printing device is connected to holder 15 by means of frame 6 so as to achieve an apparatus wherein the ink jet printing device and holder 15 are movable with respect to each other in a controlled fashion. A dielectric substrate is mounted within holder 15 with a first surface 22 thereof facing the printing opening 39.

From the printing opening 39, ink droplets 5 are ejected onto surface 22 of dielectric substrate 21 firmly mounted in holder 15 by means of an electrothermal transducer, for example an electrical resistor 33. In a preferred version, the resistor 33 consists of a thin film metal layer on the base plate 34. When a suitable voltage pulse is applied to the resistor 33, the temperature of the ink in the vicinity of the resistor exceeds its boiling point and an ink vapor bubble is formed. This explosively expanding bubble serves to eject an ink droplet 5 out of the printing opening 39.

If desired, the resistor 33 can be covered by a thermoconductive foil (not shown), which is in close contact therewith and which protects the resistor against thermal burnout into the ink. Moreover, such foil makes the resistor insensitive to the chemical properties of the ink used.

When a pressurized ink supply system is used, a drainage system for leaking ink as shown in FIG. 2a is useful. Any excess ink leaving the printing opening 39 is drawn by a reduced pressure P4 into an intake aperture 40. A lateral cover 41 is provided to form the intake aperture 40. Typical dimensions of the intake aperture are about 10 to 500 □m (for printing opening diameters of 20 to 1000 □m).

Figure 2C:
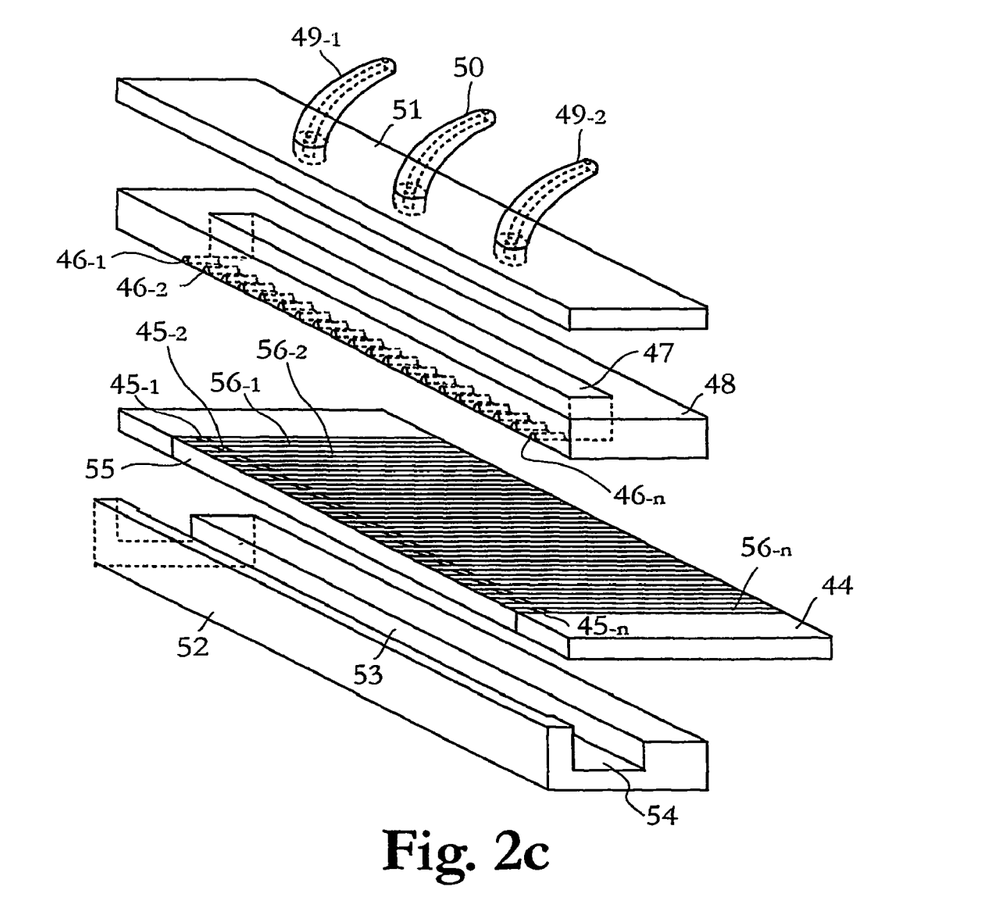
FIG. 2*c* illustrates, in an exploded perspective view, a second particular embodiment of a printing head for ejecting a liquid conductive substance as being comprised in an exemplary one of the system for producing an antenna device as illustrated in FIG. 1.

FIG. 2c shows a one column matrix printing head for an ink jet printer according to a further embodiment, the head having n printing openings. A base plate 44 carries n resistors 45-1 to 45-n of approximately 150Ω each. Each single resistor is connected at one end to a common ground electrode 55, the other ends of the resistors being connected to electrodes 56-1 to 56-n. The base plate 44 is bonded to a cover plate 48 provided with grooves which cooperate with the base plate 44 to define printing channels 46-1 to 46-n of 40 □m in width which all terminate in a common ink reservoir 47. The ink reservoir 47 is covered by a plate 51 provided with an air vent tube 50 and ink supply tubes 49-1, 49-2 connected to an ink supply tank (not shown).

The printing head is provided with a drain system consisting of an intake plate 52 having a slot 53 of a width of 30 □m which is connected to a drainage chamber 54, the latter being maintained under a reduced pressure in use.

In operation, voltage pulses are applied between the common ground electrode 55 and one or more of the individual electrodes 56-1 to 56-n, whereby matrix printing is carried out as the printing head and the recording medium are moved relative to each other. The embodiments above have been described with reference to a device in which each printing opening is created by an end of a respective printing channel. It is, however, equally suited for devices in which the printing openings are provided along the length of one or more printing channels, whereby the ink droplets are ejected sideways out of the channel(s).

While the ink jet printing device for use in the present invention has been described in two embodiments by way of example it shall be appreciated that the same can be varied in a plurality of ways. Such further variations regarding ink jet printers and ink jet printing technologies may be found in U.S. Pat. Nos. 4,050,075 issued to Hertz et al. and U.S. Pat. No. 6,155,680 issued to Belon et al., and in references therein, all of which being hereby incorporated by reference.

Figure 2D:
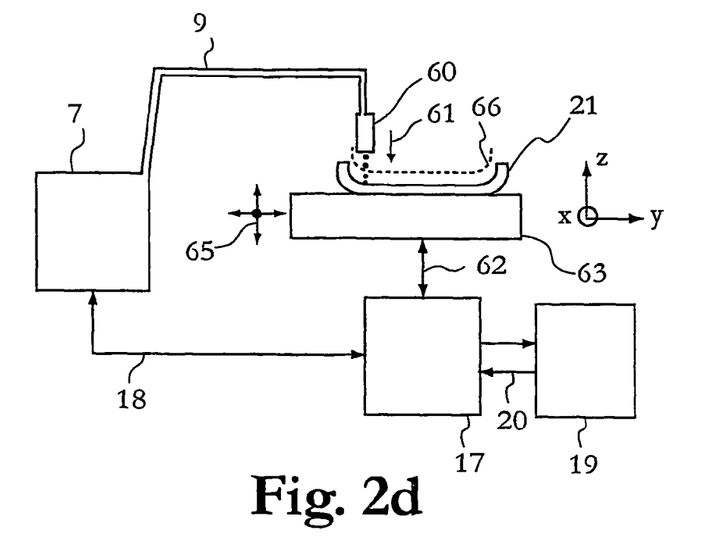
FIG. 2*d* illustrates, schematically, a particular embodiment of the system for producing an antenna device as illustrated in FIG. 1.

With reference next to FIG. 2d, which schematically illustrates a particular embodiment of the system for producing an antenna device as illustrated in FIG. 1, an important feature of the present invention is described.

The system comprises a printer device including a container 7, a conduit 9 and a printing head 60, the printing head having an opening through which conductive paint or ink can be ejected in a direction as indicated by arrow 61. The system further comprises a table 63 movable in three dimensions as indicated by arrows 65. The table may for instance be an XY-table movable in an XY-plane oriented orthogonally to the direction 61 of the ink or paint ejection from head 60, which is further provided with means for being movable in a third direction Z orthogonal to the XY-plane.

The movement of table 63 as well as ink or paint ejection from the printer device are controlled from a control unit 17 by means of control lines 18 and 62, respectively. As in the FIG. 1 system the control unit is provided with an input/output device 18 through communication line 20.

By means of the system of FIG. 2d antenna patterns may be formed on essentially non-planar surfaces such as curved, convex and concave surfaces and still maintain a substantially constant distance between the opening of the printing head and the non-planar surface on which the antenna pattern is to be formed.

In operation a dielectric substrate 21, having an essentially non-planar surface on which the antenna pattern is to be formed, is mounted at table 63, whereafter table 63 is moved in the XY-plane and in the Z-direction while ejecting liquid conductive substance from printing head 60. The movement in the XY-direction is indicative of the antenna pattern to be produced and the movement in the Z-direction is performed to follow the non-planar surface of the dielectric substrate 21, i.e. to obtain a constant distance to the non-planar surface of the dielectric substrate 21 during production. The movement in the Z-direction is thus performed to keep the opening of printing head 60 on a level with dotted line 66.

Figure 3A:
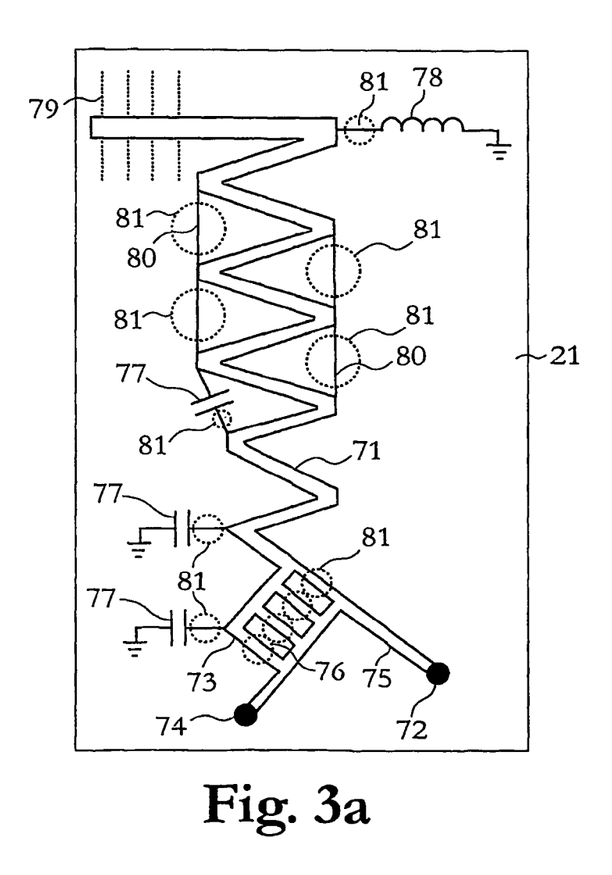
FIGS. 3*a-b* illustrate, schematically in top views, two different antenna patterns as produced according to production methods of the present invention.
Figure 3B:
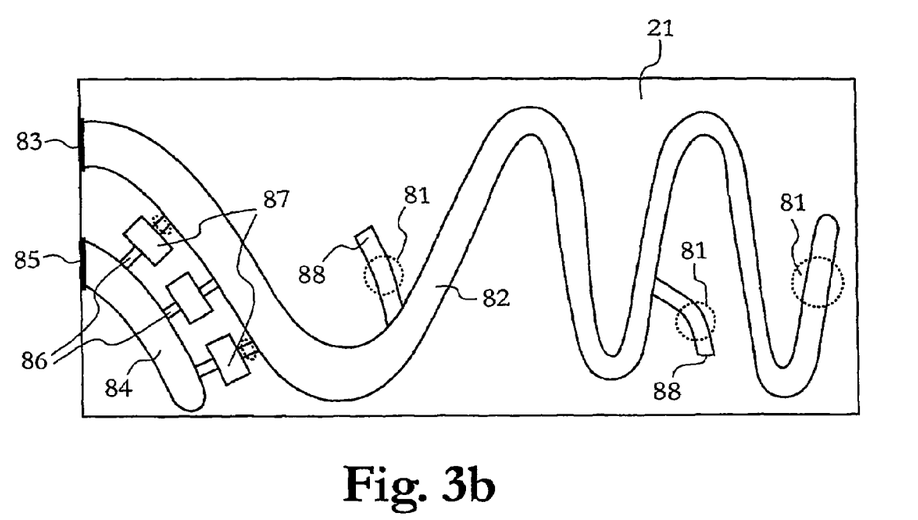

With reference next to FIGS. 3a and b, which illustrate schematically in top views, two different antenna devices as produced according to production methods of the present invention.

FIG. 3a shows an antenna device comprising a meander pattern 71 produced on a dielectric substrate 21, for instance a stiff or a flexible substrate. Using a flexible substrate enables the shape of the substrate to be adapted to the shape of the casing of the portable radio communication device in which it is to be mounted.

The meander shaped antenna pattern 71 has a feed connection point 72 and a number of parallel feed and ground lines 73, all connected to a feed point 72 and a ground point 74 via a common main feed line 75 and a ground line 76, respectively. The antenna element also comprises additional capacitive components 77 and an inductive component 78 connected to ground. The dotted lines 79 illustrate some positions where the length of the antenna pattern 1 can be adjusted. The reference numerals 80 designate short circuiting lines between different points of the antenna element.

The capacitive and inductive components 77, 78 are illustrated as discrete components. However, the desired capacitance or inductance can easily be provided by means of suitable formed conductive path. of the same kind as the conductive path of the antenna element and applied on the same substrate as the antenna element and connected thereto, as is known in the art.

FIG. 3b illustrates a further meander-shaped antenna pattern 82 formed on a substrate 21 in accordance with the present invention. Antenna pattern 82 is grounded at point 83. A main feed line 84 connects a common feed connection 85 to a plurality of feed branches 86. Some of the feed branches comprise suitable capacitances and/or inductances 87. Some tuning stubs 88 are added to the antenna pattern which stubs can be formed as desired for fine frequency tuning of the band frequencies.

Figure 3C:
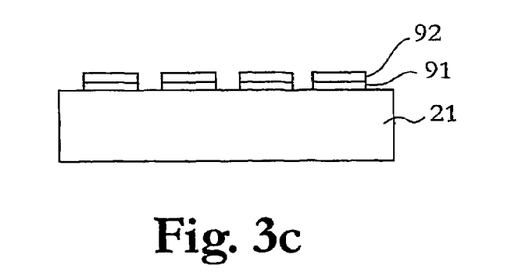
FIGS. 3*c-d* illustrate, schematically in cross-sectional views, two further antenna patterns as produced according to production methods of the present invention.
Figure 3D:
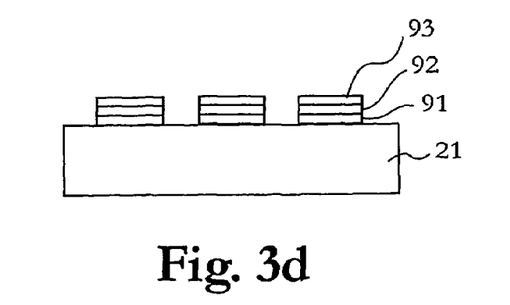

Turning now to FIGS. 3c and d, which illustrate, schematically in cross-sectional views, two further antenna patterns as produced according to production methods of the present invention.

According to a first production process a pattern 91 of a liquid substance is formed on a dielectric substrate by means of any of the apparatus as illustrated in FIGS. 1-2, the result of which being illustrated in FIG. 3c. The liquid substance may be conductive ink obtained by kneading a conductive pigment and a mixture of an adhesive and a solvent. The adhesive used may be selected from among methacrylic acid ester resins such as an ABS resin, ethyl cellulose, and phenol resin. The solvent used may be selected from among acetone, ethyl acetate, cellosolve derivatives, ketones, benzene, toluene, and ethylene chloride. The conductive pigment used may be selected from among silver powder, silver oxide, silver nitrate, organic compounds of silver, and copper powder.

The conductive ink layer 91 is provided so that a plated metal layer 92 adheres satisfactorily thereto. The conductive ink layer 23 is selectively chemically plated with a metal layer 92 of a conductive metal such as nickel or copper such that the plated metal layer 92 obtains a pattern substantially matching pattern 91 and overlying the same.

Optionally, adhesive in the conductive ink is etched away from the conductive ink layer 91 to make the surface thereof rough, the rough surface of the ink layer 92 is then chemically plated with a conductive metal such as nickel or copper in the presence of a catalyst such as platinum.

The conductive ink layer 91 and plated metal layer 92 thus formed improve the antenna performance of the antenna device.

Instead of chemically plating the metal it can be ion plated or electrolytically plated.

Referring now to FIG. 3d, an antenna device is produced by means of forming a conductive ink pattern 91 using any of the ejecting or printing apparatus of previous embodiments and versions of the invention, forming a metal pattern 92 on the conductive ink layer 91 by means of selective chemical plating, and on the chemical plated pattern 92 selectively forming an electrolytically plated metal layer 93.

The chemically plated layer 92 is formed by selectively chemically plating a conductive metal onto the conductive ink layer 91 and the electrolytically plated layer 93 is formed by selective electrolytic plating on the chemically plated layer 24 such that the three patterns are corresponding to each other and aligned such that they overlying each other.

The electrolytic plating brings about a thicker plated pattern compared to the chemical plating, so that the antenna device of FIG. 3*d* has more quantity of a conductive metal than the antenna device of FIG. 3*c*.

It shall be appreciated that while the plated metal overlying the primary pattern written onto the dielectric substrate can operate as an antenna by itself, the liquid substance primarily formed on the dielectric substrate can be an electrically insulating material.

Further details regarding selective metal plating may be found in U.S. Pat. No. 5,768,217 issued to Sonoda et al. and U.S. Pat. No. 5,685,898 issued to Dupuis et al., which patents are hereby incorporated by reference.

Figure 4:
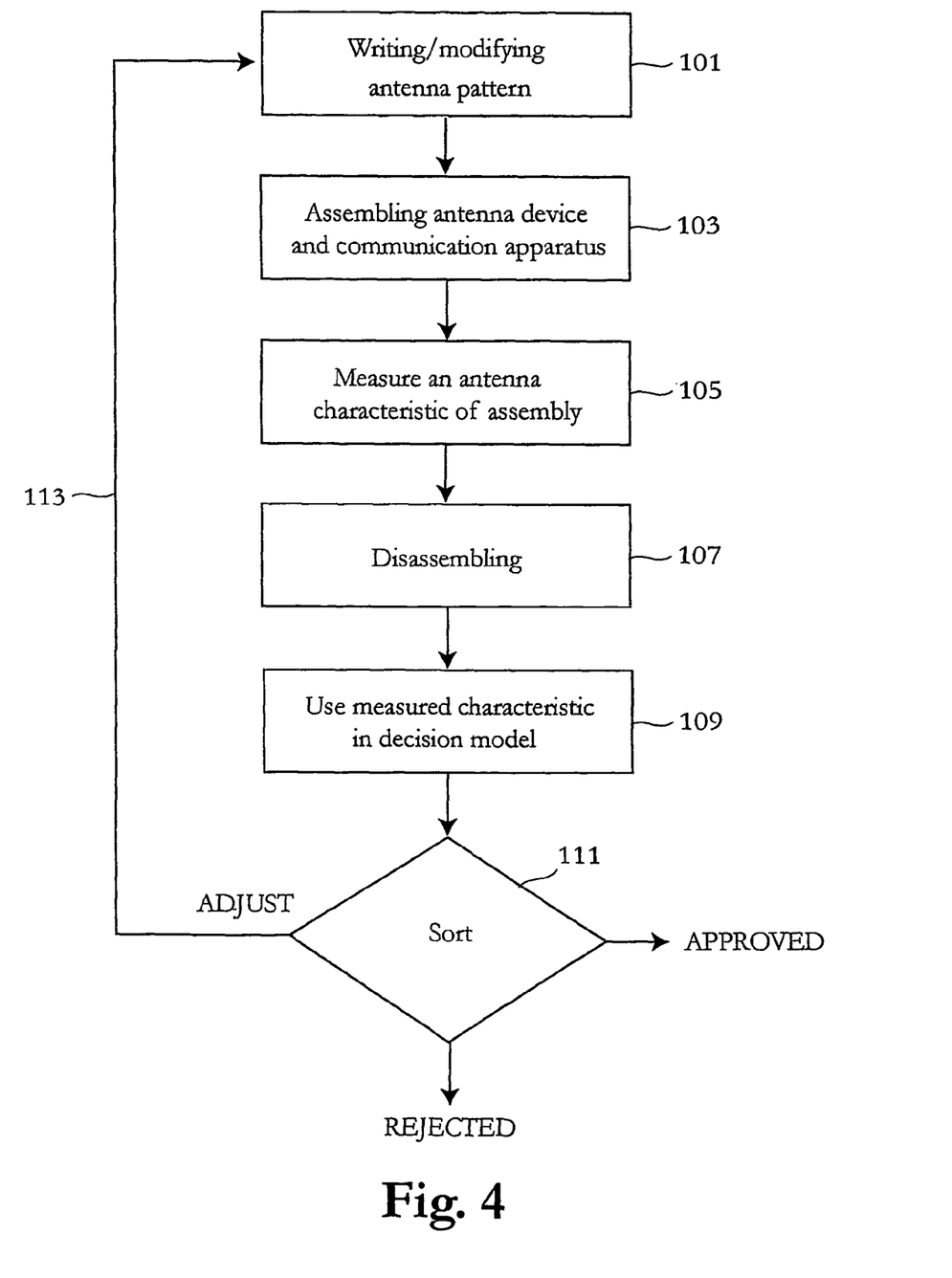
FIG. 4 is a flow scheme of a method according to a yet a further embodiment of the present invention.

With reference now to FIG. 4, which is a flow scheme of an iterative production process, a further embodiment of the present invention will be described.

As the production of an antenna device in accordance with the method described with reference to e.g. FIG. 1 is flexible, it can advantageously be combined with an iterative production process including a decision model, wherein the antenna device can be adjusted, corrected or modified in the production line.

In a first step 101 of the process an antenna pattern is formed on a dielectric substrate in accordance with the method described with reference to FIG. 1 Thereafter, in a step 103 the dielectric substrate with the antenna pattern formed thereon and a portable radio communication apparatus of a particular model are assembled wherein the antenna pattern is electrically connected to an RF feed device of said portable radio communication apparatus of the particular model.

Subsequently, in a step 105 at least one antenna characteristic during operation of the assembled portable radio communication apparatus of the particular model is measured/tested. The antenna characteristic to be measured can be e.g. antenna gain, return loss, far field, near field, or SAR characteristics.

Subsequent to testing, in a step 107, the dielectric substrate with said antenna pattern formed thereon and the portable radio communication apparatus of the particular model are disassembled wherein the antenna pattern is electrically disconnected from the RF feed device of the portable radio communication apparatus.

The, the measured antenna characteristic is, in a step 109, used in a decision model to decide on whether the characteristic is acceptable, if it is not fully acceptable but indicate that it could be acceptable subsequent to certain modification of the antenna pattern, or not all acceptable. Finally, in a step 111 the dielectric with the antenna pattern is sorted according to the taken decision: if the characteristic is acceptable the dielectric with the antenna pattern is approved as a produced antenna device, if it is not at all acceptable the dielectric with the antenna pattern is rejected, and if the dielectric with the antenna pattern is to be modified it is, in a step 113, returned to the ejecting apparatus such that, again in a step 101, a further modified conductive antenna pattern can be formed on the dielectric. The process then continues with the steps 103-111 until the dielectric with the antenna patterns or modified antenna pattern ultimately will be approved or rejected.

Further, the production process can be arranged such that, in dependence on the measured antenna characteristic, portions of the antenna pattern formed on the dielectric substrate are removed, particularly by means of laser cutting.

Returning to FIGS. 3*a* and *b*, several details of the antenna pattern may be the result of modifications and adjustments of the kind described above. For instance components 73, 77, 78, pattern length at 79, and 80 of the antenna pattern illustrated in FIG. 3*a* and components 87 and 88 of the antenna pattern illustrated in FIG. 3*b* are examples of additional structure that can be applied to an initially formed antenna pattern. Similarly, dotted circles 81 in the antenna patterns of FIG. 3*a* and b can indicate positions where electrical paths are disrupted by means of removing antenna material.

It shall be appreciated that the production process described above can be applied in the initial phase of the mass production of a particular antenna device. Thus, the ultimately approved antenna device with the modified antenna pattern can used as a template for the mass production of antenna devices for use in portable radio communication apparatus of the particular model.

Aspects of modification, redesign and production measurements are further described in our copending Swedish patent applications No. 9904773-0 entitled A method and a blank for use in the manufacturing of an antenna device and filed on Dec. 23, 1999, and No. 0004280-4 entitled Production measurements and filed on Nov. 22, 2000, which applications are hereby incorporated by reference.

The invention claimed is:

1. A method of producing an antenna device for use in a portable radio communication apparatus, said method comprising the steps of:
    providing a dielectric substrate having a first and a second surface opposite to each other; said first surface of said dielectric substrate being essentially non-planar;
    providing an ejecting apparatus that is adapted to form antenna patters on said dielectric substrate;
    ejecting a liqyid electrically conductive substance from said ejecting apparatus onto the first surface of said dielectric substrate, said ejecting apparatus having a container filled with said liquid conductive substance, an ejection opening in liquid communication with said container, and an implement for ejecting liquid conductive substance from said container through said opening; and
    moving said dielectric substrate and said ejection opening relative each other while ejecting said liquid conductive substance to thereby form, upon being solidified, a conductive antenna pattern on the first surface of said dielectric substrate.

2. The method of producing as claimed in claim 1 wherein the steps of ejecting and moving are controlled from a control unit.

3. The method of producing as claimed in claim 2 wherein the steps of ejecting and moving are controlled from a microcomputer.

4. The method of producing as claimed in claim 1 wherein said liquid conductive substance solidification is speeded up by heating said liquid conductive substance ejected from said ejecting apparatus onto the first surface of said dielectric substrate.

5. The method of producing as claimed in claim 1 wherein said liquid conductive substance solidification is speeded up by blowing a gas over said liquid conductive substance ejected from said ejecting apparatus onto the first surface of said dielectric substrate.

6. The method of producing as claimed in claim 5 wherein said solidification of said liquid conductive substance is speeded up by blowing dry air over said liquid conductive substance ejected from said ejecting apparatus onto the first surface of said dielectric substrate.

7. The method of producing as claimed in claim 1 wherein said liquid conductive substance is conductive ink and said ejecting apparatus is an ink jet printer.

8. The method of producing as claimed in claim 1 wherein said liquid conductive substanceis any of conductive paint, conductive ink, a conductive resin, and a conductive adhesive, and said ejecting apparatus is any of a drops gun, an atomizer, a blow-by gun, and a paint spray gun.

9. The method of producing as claimed in claim 1 wherein said dielectric substrate constitute part of the outer casing of the portable radio communication apparatus when being attached thereto.

10. The method of producing as claimed in claim 9 wherein said second surface of said dielectric substrate constitute part of the exterior surface of the outer casing of the portable radio communication apparatus when being attached thereto to thereby protect said antenna pattern formed on said first surface of said dielectric substrate from damage.

11. The method of producing as claimed in claim 1 wherein said first surface of said dielectric substrate, is curved.

12. The method of producing as claimed in claim 11 wherein said first surface of said dielectric substrate, is concave.

13. The method of producing as claimed in claim 11 wherein the distance between said first surface of said dielectric substrate and said ejection opening of said ejecting apparatus is substantially constant.

14. The method of producing as claimed in claim 1 wherein said dielectric substrate is any of a SIM-card, a PCB, a casing, a display, a key pad, a battery, and a battery pack comprised in said portable radio communication apparatus.

15. The method of producing as claimed in claim 1 further comprising ejecting liquid conductive substance from said ejecting apparatus onto the second surface of said dielectric substrate while moving said dielectric substrate and the ejection opening of said ejecting apparatus relative each other to thereby form, upon being solidified, a second conductive antenna pattern on the second surface of said dielectric substrate.

16. The method of producing as claimed in claim 15 wherein the step of plating is preceded by the step of etching away a surface portion of said conductive antenna pattern to thereby make the surface thereof rough.

17. The method of producing as claimed in claim 1 wherein a conductive metallic layer is selectively plated on said conductive antenna pattern, said metallic layer having a pattern substantially matching said conductive antenna pattern and overlying the same, to thereby increase the antenna performance of said antenna device.

18. The method of producing as claimed in claim 17 wherein the step of plating is performed by means of any of ion, chemical, and electrolytic plating.

19. A method of producing an antenna device for use in a portable radio communication apparatus, said method comprising the steps of:
  providing a dielectric substrate having a first and second surface opposite to each other;
  providing an ejecting apparatus that is adapted to form antenna patters on said dielectric substrate;
  ejecting a liquid electrically conductive substance from said ejecting apparatus onto the first surface of said dielectric substrate, said ejecting apparatus having a container filled with said liquid conductive substance, an ejection opening in liquid communication with said container, and an implement for ejecting liquid conductive substance from said container through said opening:
  moving said dielectric substrate and said ejection opening relative each other while ejecting said liquid conductive substance to thereby form, upon being solidified, a conductive antenna pattern on the first surface of said dielectric substrate.
  said dielectric substrate with the antenna pattern formed on said first surface thereof and a portable radio communication apparatus of a particular model are assembled wherein the antenna pattern is electrically connected to an RF feed device of said portable radio communication apparatus of the particular model;
  at least one antenna characteristic during operation of said assembled portable radio communication apparatus of the particular model is measured;
  said dielectric substrate with said antenna pattern formed on said first surface thereof and said portable radio communication apparatus of the particular model are disassembled wherein the antenna pattern is electrically disconnected from the RF feed device of said portable radio communication apparatus; and
  in dependence on said measured antenna characteristic ejecting liquid conductive substance from said ejecting apparatus onto the first surface of said dielectric substrate while moving said dielectric substrate and the ejection opening of said ejecting apparatus relative each other to thereby form, upon being solidified, a modified conductive antenna pattern on the first surface of said dielectric substrate.

20. The method of producing as claimed ut claim 19 wherein the steps of assembling, measuring, disassembling and forming a modified antenna pattern are repeated until said measured antenna characteristic is lying within a predetermined acceptable interval.

21. The method of producing as claimed in claim 19 wherein
  said dielectric substrate with the antenna pattern formed on said first surface thereof and said portable radio communication apparatus of the particular model are assembled wherein the antenna pattern is electrically connected to an RF feed device of said portable radio communication apparatus;
  at least one antenna characteristic during operation of said assembled portable radio communication apparatus of the particular model is measured;
  said dielectric substrate with said antenna pattern formed on said first surface thereof and said portable radio communication apparatus of the particular model are disassembled wherein the antenna pattern is electrically disconnected from the RF feed device of said portable radio communicaton apparatus of the particular model; and
  depending on said measured antenna characteristic removing, particularly by means of laser cutting, portions of the antenna pattern formed on the first surface of said dielectric substrate.

22. The method of producing as claimed in claim 21 wherein the step of removing portions of tne antenna pattern formed on the first surface of said dielectric substrate depending on said measured antenna characteristic is performed by means of laser cutting.

23. The method of producing as claimed in claim 19 wherein said modified antenna pattern is used as a template for the mass production of antenna devices for use in portable radio communication apparatus of the particular model.

24. A method of producing an antenna device for use in a portable radio communication apparatus, said method comprising the steps of:
   providing a dielectric substrate having a first and a second surface opposite to each other; said first surface of said dielectric substrate being essentially non-planar
   providing an ejecting apparatus that is adapted to form antenna patters on said dielectric substrate;
   mounting said dielectric substrate on a bench fixedly, said bench being movable in a plane substantially perpendicular to the direction of the liquid conductive substance to be ejected and being movable in a direction parallel with the direction of the liquid conductive substance to be ejected; a distance between said first surface of said dielectric substrate and said election opening of said ejecting apparatus being substantially constant:
   ejecting a liquid electrically conductive substance from said ejecting apparatus onto the first surface of said dielectric substrate, said ejecting apparatus having a container filled with said liquid conductive substance, an ejection opening in liquid communication with said container, and an implement for ejecting liquid conductive substance from said container through said opening; and
   moving said dielectric substrate and side ejection opening relative each other and moving said bench in said plane and said direction while ejecting said liquid conductive substance to thereby form, upon being solidified, said conductive antenna pattern on the first and essentially non-planar surface of said dielectric substrate.

\* \* \* \* \*

UNITED STATES PATENT AND TRADEMARK OFFICE
CERTIFICATE OF CORRECTION

PATENT NO. : 7,480,979 B2
APPLICATION NO. : 10/451437
DATED : October 17, 2003
INVENTOR(S) : Stefan Morén Page 1 of 1

It is certified that error appears in the above-identified patent and that said Letters Patent is hereby corrected as shown below:

CLAIM 1
Column 8, line 43: replace "liqyid" with "liquid"

CLAIM 8
Column 9, line 13: replace "substanceis" with "substance is"

Signed and Sealed this

Twenty-first Day of April, 2009

JOHN DOLL
*Acting Director of the United States Patent and Trademark Office*

UNITED STATES PATENT AND TRADEMARK OFFICE
CERTIFICATE OF CORRECTION

| | |
|---|---|
| PATENT NO. | : 7,480,979 B2 |
| APPLICATION NO. | : 10/451437 |
| DATED | : January 27, 2009 |
| INVENTOR(S) | : Stefan Morén |

It is certified that error appears in the above-identified patent and that said Letters Patent is hereby corrected as shown below:

<u>CLAIM 1</u>
Column 8, line 43: replace "liqyid" with "liquid"

<u>CLAIM 8</u>
Column 9, line 13: replace "substanceis" with "substance is"

This certificate supersedes the Certificate of Correction issued April 21, 2009.

Signed and Sealed this

Twelfth Day of May, 2009

JOHN DOLL
*Acting Director of the United States Patent and Trademark Office*